(12) United States Patent  (10) Patent No.: US 7,303,825 B2
Goto et al.                (45) Date of Patent:    Dec. 4, 2007

(54) ELECTROLUMINESCENCE DEVICE

(75) Inventors: Yasuyuki Goto, Fukuoka (JP);
 Mitsuharu Noto, Kurume (JP)

(73) Assignees: Kyushu Electric Power Co., Inc.,
 Fukuoka (JP); Daiden Co., Ltd.,
 Fukuoka (JP)

( * ) Notice: Subject to any disclaimer, the term of this patent is extended or adjusted under 35 U.S.C. 154(b) by 0 days.

(21) Appl. No.: 10/543,036

(22) PCT Filed: Jan. 21, 2003

(86) PCT No.: PCT/JP03/00492

§ 371 (c)(1),
(2), (4) Date: Jul. 21, 2005

(87) PCT Pub. No.: WO2004/066684

PCT Pub. Date: Aug. 5, 2004

(65) Prior Publication Data

US 2006/0049746 A1    Mar. 9, 2006

(51) Int. Cl.
 *H01L 51/50* (2006.01)
(52) U.S. Cl. .............. 428/690; 428/917; 313/504; 313/506
(58) Field of Classification Search ........ 428/690, 428/917; 313/504, 506
 See application file for complete search history.

(56) References Cited

U.S. PATENT DOCUMENTS

| 5,783,292 | A  | * | 7/1998  | Tokito et al. ............... 428/212 |
| 5,871,579 | A  | * | 2/1999  | Liang et al. ................ 117/68  |
| 6,097,147 | A  | * | 8/2000  | Baldo et al. ................ 313/506 |
| 6,631,147 | B2 | * | 10/2003 | Taniguchi et al. ........... 372/39   |
| 2001/0051284 | A1 | * | 12/2001 | Ueda et al. ............... 428/690 |
| 2002/0101154 | A1 | * | 8/2002  | Seo et al. ................ 313/506 |
| 2002/0192499 | A1 | * | 12/2002 | Tokailin et al. ........... 428/690 |

FOREIGN PATENT DOCUMENTS

| EP | 0 489 156 A1 | 6/1992 |
| JP | 1-213989 A   | 8/1989 |
| JP | 1-217885 A   | 8/1989 |
| JP | 3-126787 A   | 5/1991 |
| JP | 7-263146 A   | 10/1995 |
| JP | 8-288067 A   | 11/1996 |
| JP | 10-8044 A    | 1/1998 |
| WO | WO-91/03141 A1 | 3/1991 |
| WO | WO-01/01501 A1 | 1/2001 |

OTHER PUBLICATIONS

Patent Abstracts of Japan for JP2003-59665 published Feb. 28, 2003.

(Continued)

*Primary Examiner*—Dawn L. Garrett
(74) *Attorney, Agent, or Firm*—Darby & Darby PC

(57) ABSTRACT

There is provided an electroluminescence device capable of causing an inorganic compound to emit light at a direct current voltage (low voltage), and whose luminescent color can be changed by dispersing the inorganic compound in an organic compound layer as an emissive layer. There is provided an electroluminescence device for emitting light through recombination of a hole injected from an anode and an electron injected from a cathode, wherein a single organic compound layer or plural organic compound layers are provided between the anode and the cathode, and an inorganic compound is dispersed in at least one layer of the organic compound layers.

23 Claims, 11 Drawing Sheets

OTHER PUBLICATIONS

Patent Abstracts of Japan for JP2003-36977 published Feb. 7, 2003.
Patent Abstracts of Japan for JP2002-299063 published Oct. 11, 2002.
Patent Abstracts of Japan for JP2001-196178 published Jul. 19, 2001.
International Search Report for PCT/JP2003/000492 mailed Apr. 30, 2003.
Patent Abstracts of Japan for JP2001-196176 published Jul. 19, 2001.
Patent Abstracts of Japan for JP03-126787 published May 29, 1991.
Patent Abstracts of Japan for JP09-202878 published Aug. 5, 1997.
Patent Abstracts of Japan for JP06-096861 published Apr. 8, 1994.
Patent Abstracts of Japan for JP1-213989 published on Aug. 28, 1989.
Patent Abstracts of Japan for JP1-217885 published on Aug. 31, 1989.
Patent Abstracts of Japan for JP10-8044 published on Jan. 13, 1998.
Patent Abstracts of Japan for JP8-288067 published on Nov. 1, 1996.
Patent Abstracts of Japan for JP7-263146 published on Oct. 13, 1995.
Patent Abstracts of Japan for JP3-126787 published on May 29,1991.

* cited by examiner

ELECTROLUMINESCENCE DEVICE

CROSS-REFERENCE TO PRIOR APPLICATION

This is a U.S. national phase application under 35 U.S.C. §371 of International Patent Application No. PCT/JP2003/000492 filed Jan. 21, 2003 which is incorporated by reference herein. The International Application was published in Japanese on Aug. 5, 2004 as WO 2004/066684 A1 under PCT Article 21(2).

TECHNICAL FIELD

The present invention relates to an electroluminescence device.

More specifically, the invention relates to an electroluminescence device capable of driving (light emitting) an inorganic compound with a direct current voltage (low voltage).

Also, the invention relates to an electroluminescence device capable of changing a luminescent color by dispersing an inorganic compound in an organic compound layer which is an emissive layer.

Further, the invention relates to an electroluminescence device in which a luminescent color is changed by replacing the inorganic compound dispersed in an organic compound layer.

BACKGROUND ART

Electroluminescence devices are used for display component such as thin film panels and cylindrical panels, surface luminous bodies such as large-area panels, and various other devices. In particular, recently, electroluminescence devices have begun to be widely used for oscillation device of optoelectronics such as electronic devices for laser beam, and so on.

The electroluminescence device is classified into an inorganic electroluminescence device in which an inorganic compound is used in the emissive layer and an organic electroluminescence device in which an organic compound is used in the emissive layer.

The inorganic electroluminescence device is a system in which an inorganic compound is sandwiched by insulating layers and which is driven by application of an alternating current voltage and is a genuine electroluminescence device in which a high-speed electron accelerated in the high electric field collides with and excites the luminescent center portion. The inorganic electroluminescence device is put into practical use in, for example, a green luminescent display.

The organic electroluminescence device has a structure in which a thin film containing an organic compound is interposed between an anode and a cathode and is a type in which electrons and holes are injected in this thin film, thereby undergoing luminescence by the energy of their recombination (also called "charge injection type"). The organic electroluminescence device can emit light of high luminance at a low direct current voltage of from several volts and several tens of volts and is expected to be applied to various luminescence devices, display devices, and the like.

As described previously, the inorganic electroluminescence device using an inorganic compound in the emissive layer is put into practical use in green luminescent displays, etc. However, in order to drive the inorganic electroluminescence device, an alternating current power supply and a high voltage are necessary, and places and ranges where the inorganic electroluminescence device can be used are limited.

In the light of the above, at present, studies regarding organic electroluminescence devices capable of emitting light with high luminance at a low direct current voltage are being intensively performed, and new studies for putting inorganic electroluminescence devices into practical use are not as numerous now. Accordingly, the results of useful studies (such as luminescence characteristics) regarding inorganic electroluminescence devices which have hitherto been accumulated are not thoroughly utilized.

On the other hand, as described previously, the organic electroluminescence device using an organic compound in the emissive layer can undergo luminescence with a high luminance at a direct current low voltage. However, in comparison with the inorganic electroluminescence device, the organic electroluminescence device involved such problems that it is inferior in deterioration characteristics (lifetime) of constituent materials thereof and that it is not durable when used over a long period of time.

Also, among organic electroluminescence devices, the most of those which are generally put into practical use have an emissive layer in which a guest dye (organic dyes and fluorescence dyes such as organometallic complexes) is doped in an organic compound layer host material. In order to obtain the luminescent color necessary for high efficiency by performing optimal dye doping, a relationship of physical and chemical properties between the host material and the guest dye (for example, necessity that an emission spectrum of the host material and an absorption spectrum of the guest dye overlap each other) is important.

In the light of the above, in order to obtain a necessary luminescent color, it is necessary to suitably combine the constituent materials of the host material and the guest material, so that for example, in the case of replacing the guest dye, it is necessary to replace the host material at the same time. Accordingly, for example, in the case of manufacturing a display using an electroluminescence device, the number of necessary host materials becomes high, leading to an increase of the costs for manufacturing the display.

Then, first of all, in order to make the most of the results of useful studies regarding inorganic electroluminescence devices which have hitherto been accumulated, the present inventors made extensive and intensive investigations on the basis of ideas regarding whether or not an inorganic compound to be used in the emissive layer of an inorganic electroluminescence device can be driven at a direct current voltage (low voltage) like an organic electroluminescence device and whether or not the deterioration characteristics that are a defect of an organic electroluminescence device can be solved.

As a result, it has been found that not only it is effective means for solving the foregoing problems to prepare an electroluminescence device by dispersing an inorganic compound in an organic compound layer provided between an anode and a cathode, but also it is possible to change the luminescent color of an electroluminescence device by dispersing an inorganic compound in an organic compound layer. Also, investigations were made regarding an inorganic compound to be dispersed. As a result, it has been found that it is possible to change a luminescent color by replacing an inorganic compound to be dispersed in an organic compound layer.

The invention has been completed based on these findings.

Then, an object of the invention is to provide an electroluminescence device capable of driving (causing light emission from) an inorganic compound at a direct current voltage (low voltage).

Also, another object of the invention is to provide an electroluminescence device capable of changing the luminescent color by dispersing an inorganic compound in an organic compound layer which is the emissive layer.

Further, other object of the invention is to provide an electroluminescence device in which the luminescent color changes by replacing an inorganic compound dispersed in an organic compound layer.

The other objects of the invention will become clear by the following description.

DISCLOSURE OF THE INVENTION

The means of the invention which have been taken for the purpose of achieving the foregoing objects are as follows.

A first invention is concerned with an electroluminescence device for emitting light by recombination of a hole injected from an anode and an electron injected from a cathode, which is characterized in that:

a single organic compound layer or plural organic compound layers are present between the foregoing electrodes; and that an inorganic compound is dispersed in at least one of the organic compound layers, thereby changing the luminescent color.

A second invention is concerned with the electroluminescence device according to the first invention, which is characterized in that:

luminescence of the inorganic compound is achieved at a direct current voltage.

A third invention is concerned with the electroluminescence device according to the first or second invention, which is characterized that:

the inorganic compound or a part of the inorganic compound is replaced, thereby changing the luminescent color.

A fourth invention is concerned with the electroluminescence device according to the first, second or third invention, which is characterized in that:

the inorganic compound is a metallic compound.

A fifth invention is concerned with the electroluminescence device according to the first, second or third invention, which is characterized in that:

the inorganic compound is a transition metal compound.

A sixth invention is concerned with the electroluminescence device according to the first, second or third invention, which is characterized in that:

the inorganic compound is a rare earth metal compound.

A seventh invention is concerned with the electroluminescence device according to the first, second or third invention, which is characterized in that:

the inorganic compound is a metal halide compound.

An eighth invention is concerned with the electroluminescence device according to the first, second or third invention, which is characterized in that:

the inorganic compound is at least one compound selected from the group consisting of europium iodide, europium bromide, cerium iodide, cerium bromide, terbium iodide, and lead iodide.

A ninth invention is concerned with the electroluminescence device according to the first, second or third invention, which is characterized in that:

the organic compound is 4,4-bis(carbazole-9-yl)-bi-phenyl; and that the inorganic compound is at least one compound selected from the group consisting of cerium iodide, cerium bromide, terbium iodide, and lead iodide.

A tenth invention is concerned with the electroluminescence device according to the first, second or third invention, which is characterized in that:

the inorganic compound is a combination of a halide of europium and a halide of an alkali metal or a combination of a halide of europium and a halide of an alkaline earth metal.

The electroluminescence device is, for example, formed by the following constructions. Examples include:

(1) A construction formed by laminating a substrate, an anode (transparent electrode), an emissive layer having an inorganic compound dispersed in an organic compound, and a cathode (back electrode), in that order;

(2) A construction formed by laminating a substrate, an anode, an emissive layer having an inorganic compound dispersed in an organic compound, a single organic compound layer or plural organic material layers having electron transport properties, and a cathode, in that order;

(3) A construction formed by laminating a substrate, an anode, a single organic material layer or plural organic material layers having hole transport properties, an emissive layer having an inorganic compound dispersed in an organic compound, and a cathode, in that order; and (4) A construction formed by successively laminating a substrate, an anode, a single organic material layer or plural organic material layers having hole transport properties, an emissive layer having an inorganic compound dispersed in an organic compound, a single organic material layer or plural organic material layers having electron transport properties, and a cathode.

Also, a construction having a hole blocking layer or an electron injection layer can be used.

Examples of the substrate include glasses, plastics, and metallic thin films.

Examples of the anode (transparent electrode) include ones prepared by forming indium-tin-oxide (ITO), titanium oxide, tin oxide, or the like into a thin film by the vacuum vapor deposition method, the sputtering method, or the sol-gel method.

Examples of the organic material layer having hole transport properties include polyvinylcarbazole (PVK), phenylenediamine derivatives (for example, N,N'-bis(3-methylphenyl)-N,N'-bis(phenyl)-benzidine), triphenylamine derivatives, carbazole derivatives, and phenylstyrene derivatives.

Examples of the organic material layer having electron transport properties include oxadiazole derivatives, triazole derivatives, phenanthroline derivatives, and alumiquinolinol complexes.

The organic material layer having hole transport properties and the organic material layer having electron transport properties can be formed by the vacuum vapor deposition method, the spin coating method, or the like.

Examples of the cathode (back electrode) include lithium, aluminum, magnesium, and silver.

The emissive layer having an inorganic compound dispersed in an organic compound can be formed by the vacuum vapor deposition method, the spin coating method, or the like. However, the vacuum vapor deposition method is preferable because a uniform film is easy to obtain, and it is hard for pinholes to be formed.

In the case of the vacuum vapor deposition method, it is carried out by the vapor co-deposition method (also called "dual simultaneous vapor deposition method"). That is, a vapor deposition source for organic compound and a vapor deposition source for inorganic compound are separated from each other, and vapors evaporated from the separate vapor deposition sources are simultaneously vapor deposited onto a prescribed substrate under vacuum conditions, thereby forming a film. The concentration of the inorganic compound can be determined by setting the ratio of the vapor deposition rates of the inorganic compound and the organic compound.

In the case of the spin coating method, a thin film is formed by dissolving both the organic compound and the inorganic compound in a soluble solvent and spin coating the solution, thereby uniformly dispersing the inorganic compound in an organic semiconductor.

In the case of causing luminescence of the inorganic compound dispersed in the organic compound layer, the concentration of the inorganic compound is from 0.1 to 70 wt %, and preferably from 1 to 50 wt %. When the concentration of the inorganic compound is less than 0.1 wt %, there is the problem that the energy transfer from the organic compound to the inorganic compound becomes incomplete, whereby it is hard for the inorganic compound to emit light. When the concentration of the inorganic compound exceeds 70 wt %, the inorganic compound are excessively close to each other so that concentration quenching is likely to occur and that luminous efficiency is likely lowered.

As the organic compound which is used in the emissive layer, known materials can be used.

In the case of the vacuum vapor deposition method, examples of the organic compound include carbazole derivatives, triphenylamine derivatives, triazole derivatives (TAZ), phenylstyrene derivatives, fluorene derivatives, aluminum-quinolinol complexes and derivatives thereof, and phenylenediamine derivatives. However, the invention is never limited thereto.

In the case of the spin coating method, examples of the organic compound include polyvinylcarbazoles, polyfluorenes, polythiophenes, and polyphenylenevinylenes. However, the invention is never limited thereto.

As the inorganic compound, for example, non-metal compounds such as arsenic and metal compounds (including transition metal compounds and rare earth metal compounds) can be used.

Examples of the metal include manganese, nickel, copper, gallium, silver, cadmium, indium, tin, antimony, gold, lead, bismuth, scandium, yttrium, lanthanum, cerium, praseodymium, samarium, europium, gadolinium, terbium, dysprosium, holmium, erbium, thulium, ytterbium, and thallium. However, the invention is not limited thereto.

As the inorganic compound, metal halide compounds are preferable because they are easily vapor deposited at a relatively low temperature.

Examples of the halide include fluorides, chlorides, bromides, and iodides.

The inorganic compound can be dispersed in the organic compound layer singly or in combinations of two or more kinds thereof.

The thickness of the organic compound layer is not particularly limited. However, it is preferably from 30 nm to 400 nm, and more preferably from 60 nm to 200 nm. When the thickness of the organic compound layer is less than 30 nm, there is high possibility that the electrodes short circuit each other, while when it exceeds 400 nm, there is high possibility that the resistance value increases so that the electric current hardly flows at all.

Examples of the hole blocking layer include bathocuproine, triazole derivatives (TAZ), and oxadiazole derivatives. However, the invention is never limited thereto.

Examples of the electron injection layer include lithium fluoride and magnesium fluoride. However, the invention is never limited thereto.

Examples of the inorganic compound include a combination of a europium halide and a halide of an alkali metal and a combination of a europium halide and a halide of an alkaline earth metal.

In this case, examples of the alkali metal include lithium, sodium, potassium, rubidium, and cesium.

Also, examples of the alkaline earth metal include magnesium, calcium, strontium, and barium.

The halide of an alkali metal or the halide of an alkaline earth metal can be dispersed in the organic compound layer singly or in combinations of two or more kinds thereof.

Incidentally, examples of the halide include fluorides, chlorides, bromides, and iodides.

Figure 1:
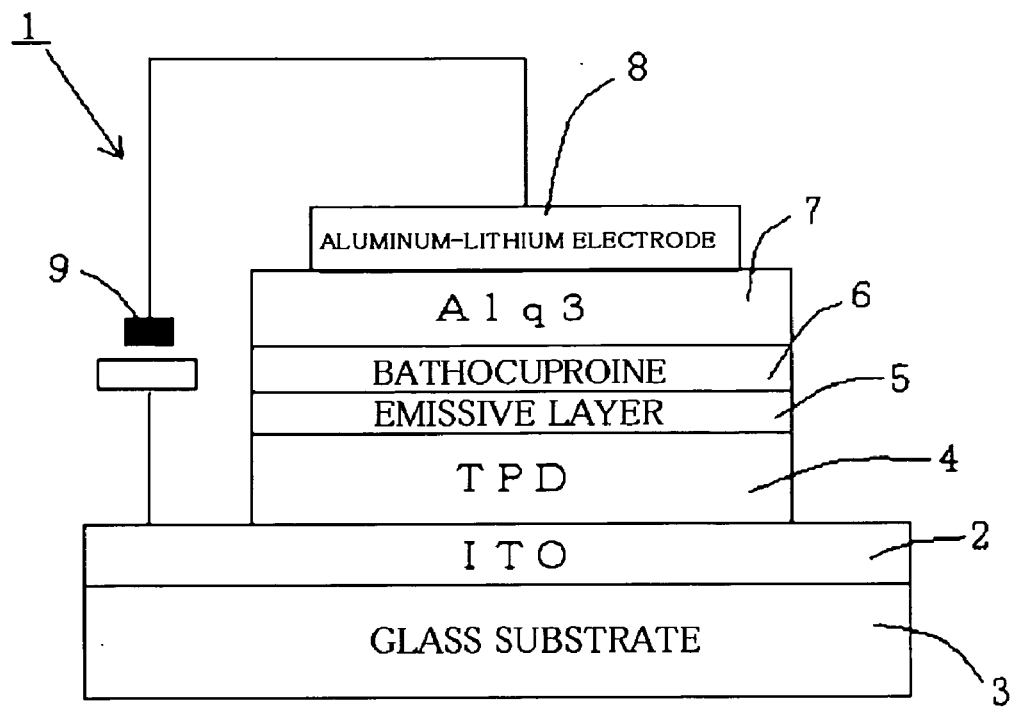
FIG. 1 is an explanatory side view to show Example 1 of the electroluminescence device according to the invention.

DESCRIPTION OF REFERENCE NUMERALS AND SIGNS 1, 1a: Electroluminescence device
2: Transparent electrode
3: Glass substrate
4: Hole transporting layer
5, 5a: Emissive layer
6: Hole blocking layer
6a: Hole blocking/electron transporting layer
7: Electron transporting layer
8, 8a: Cathode
9: Electrode
10: Electron injection layer

BEST MODE FOR CARRYING OUT THE INVENTION

The invention will be hereunder described with reference to the Examples, but it should not be construed that the invention is limited thereto.

EXAMPLE 1

Figure 2:
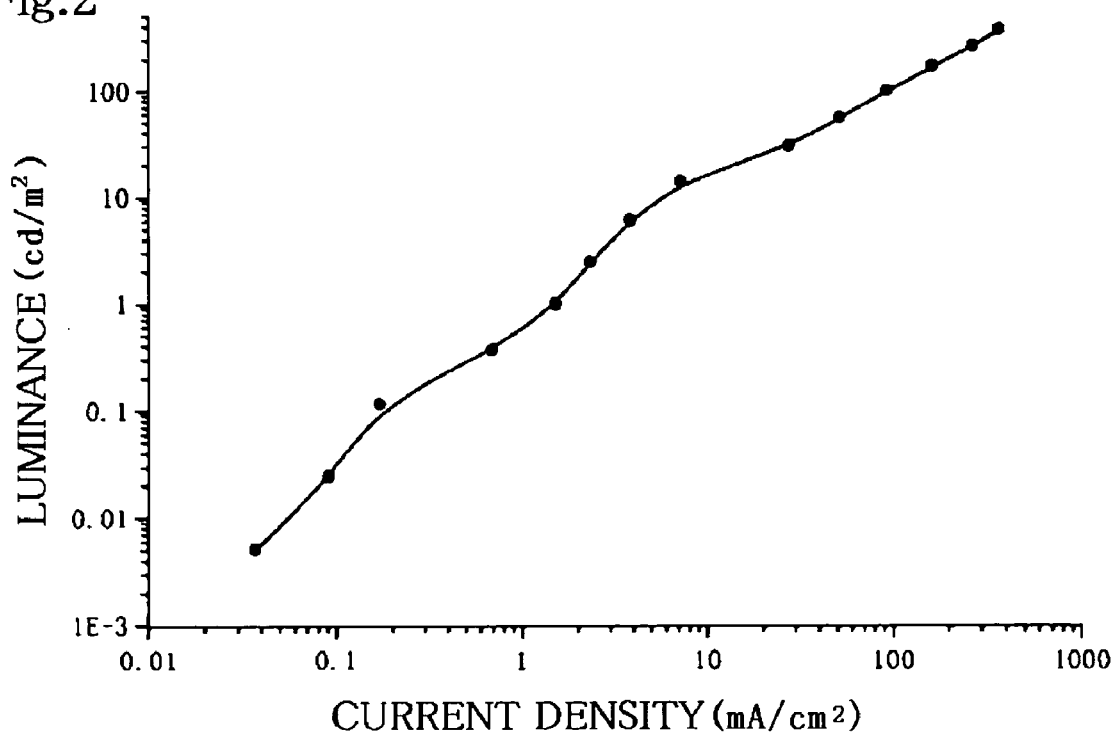
FIG. 2 is a characteristic graph to show the relationship of luminance-electric current of the electroluminescence device as shown in FIG. 1.
Figure 3:
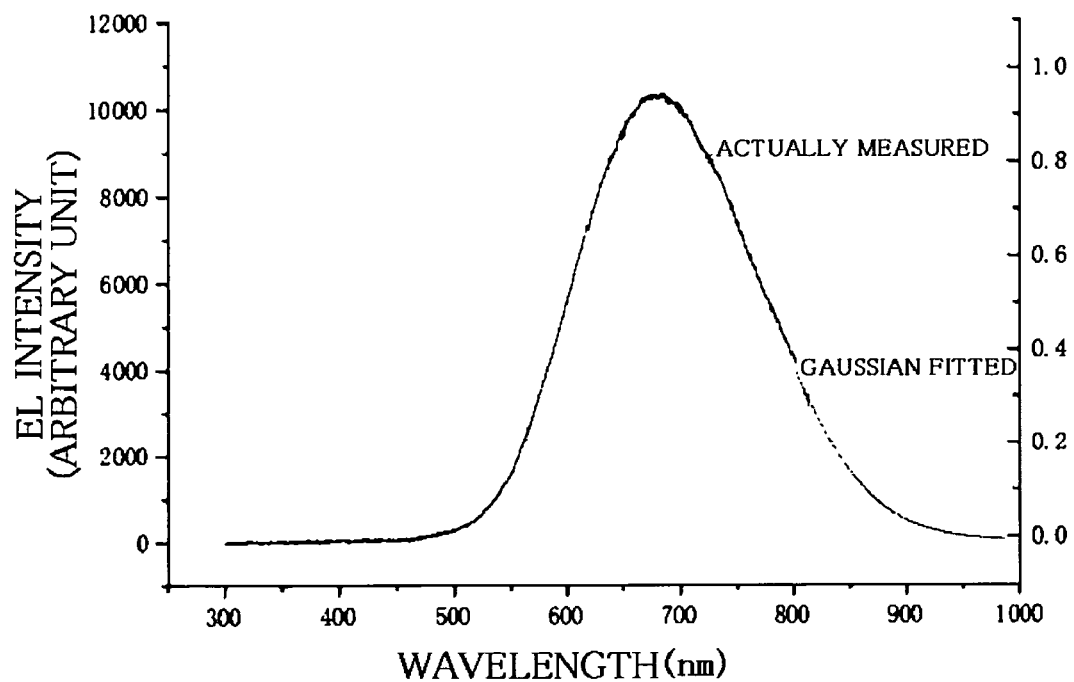
FIG. 3 is a characteristic graph of an emission spectrum of the electroluminescence device as shown in FIG. 1.

FIG. 1 is an explanatory side view to show Example 1 of the electroluminescence device according to the invention;

FIG. 2 is a characteristic graph to show the luminance-electric current relationship of the electroluminescence device as shown in FIG. 1; and FIG. 3 is a characteristic graph of an emission spectrum of the electroluminescence device as shown in FIG. 1.

Incidentally, measurement could not be achieved at 850 nm or longer due to limits of a detector to be used. For that reason, this is assumed as a Gaussian peak and extrapolated.

An electroluminescence device 1 was prepared in the following manner.

On a glass substrate 3 in which a transparent electrode 2 constructed of ITO was sputtered in a thickness of 100 nm, N,N'-bis(3-methylphenyl)-N,N'-bis(phenyl)-benzidine (TPD) was vapor deposited to have a thickness of about 40 nm by the vacuum vapor deposition method (degree of vacuum: $2.0 \times 10^{-4}$ Pa, hereinafter the same), thereby forming a hole transporting layer 4.

An emissive layer 5 was then formed thereon. The luminescence layer 5 was formed by vapor co-deposition of 4,4-bis(carbazole-9-yl)-biphenyl (referred to as "CBP" in this specification unless otherwise indicated) as an organic compound and europium iodide as an inorganic compound. A ratio of CBP to europium iodide was adjusted at 2/1 in terms of a weight ratio. The emissive layer 5 was adjusted so as to have a film thickness of 20 nm.

The vapor deposition rate is 2 angstroms/sec for CBP and 0.18 angstroms/sec for europium iodide (weight ratio: 2/1), respectively.

A hole blocking layer 6 having a thickness of 15 nm was then formed thereon by vapor deposition using bathocuproine, and an electron transporting layer 7 having a thickness of 35 nm was further formed by vapor deposition using tris(8-hydroxyquinoline) aluminum (Alq3).

Also, about 200 nm of an aluminum-lithium (AlLi) alloy was vapor deposited as an electrode thereon, thereby obtaining a cathode 8. Incidentally, in the drawing, 9 stands for an electrode.

This electroluminescence device 1 was subjected to luminescence by application of an electric current of 359 mA/cm$^2$ at a voltage of 18 V. Its luminance was measured by a luminance meter (MINOLTA LS-110) and found to be 362 cd/m$^2$.

Also, its emission spectrum was measured by a multi-channel detector (HAMAMATSU PHOTONICS PMA-11). As a result, a main luminescence wavelength was about 687 nm. No current dependency of the spectrum was observed. Its luminescence starting voltage was 5 V. Its maximum external quantum efficiency was 0.18% (luminance: 14.5 cd/m$^2$, electric current: 7.12 mA/cm$^2$).

Since the luminescence peak (singlet) of CBP as an organic compound is 404 nm (bluish purple luminescence), it is considered that the luminescence of the electroluminescence device 1 which appears at about 687 nm is not caused by CBP. On the other hand, it is known that in a europium ion, the luminescence peak shifts from 440 nm to about 700 nm due to the influence of a ligand field.

From these facts, it is considered that this luminescence (at about 687 nm) of the electroluminescence device 1 was caused by the luminescence of europium iodide as an inorganic compound due to the energy transfer from the CBP used here as the organic compound to europium iodide used here as the inorganic compound.

In the light of the above, in the CBP which comprises the organic compound layer and which by itself emits bluish purple light (luminescence peak: about 404 nm), by dispersing the inorganic compound europium iodide, a electroluminescence device 1 which emits orange light (luminescence peak: about 687 nm) could be obtained.

EXAMPLE 2

Figure 4:
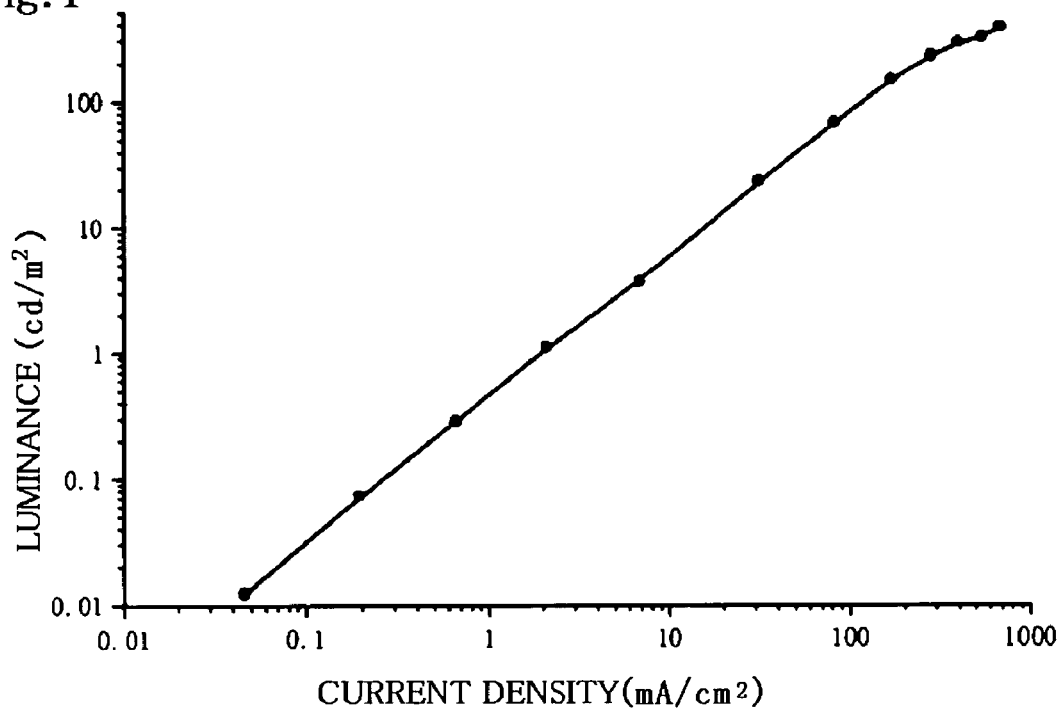
FIG. 4 is a characteristic graph to show the luminance-electric current relationship of the electroluminescence device according to Example 2.
Figure 5:
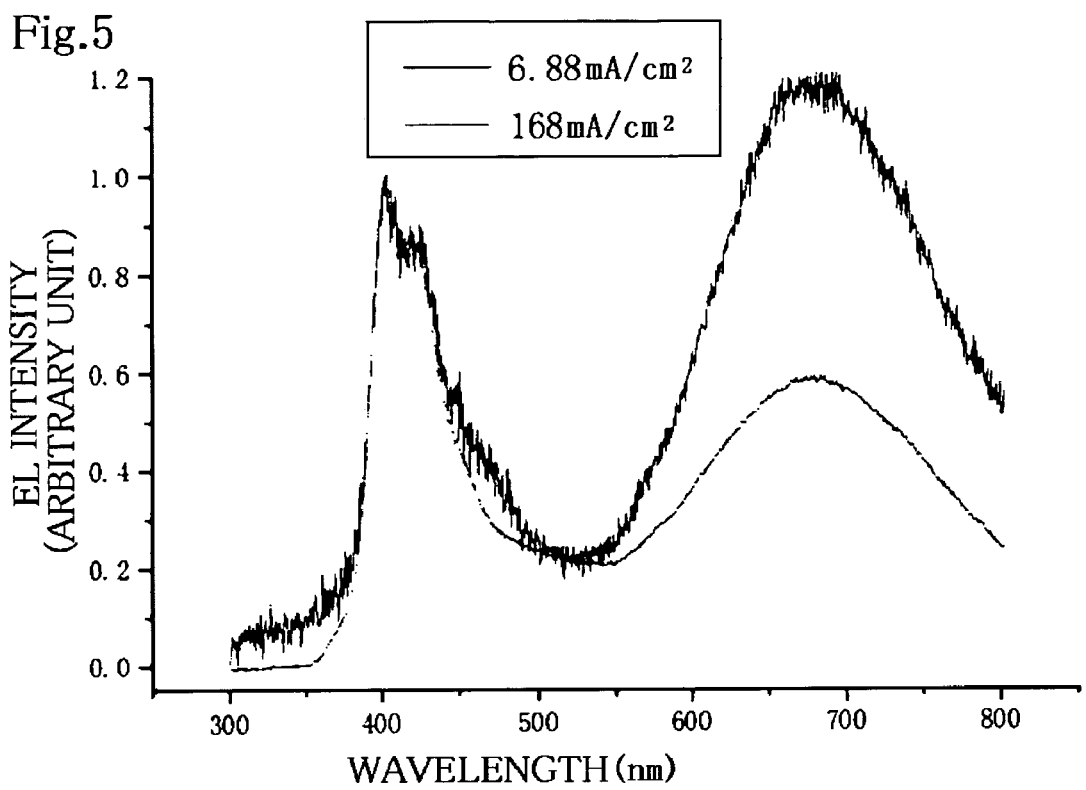
FIG. 5 is a characteristic graph of an emission spectrum of the electroluminescence device according to Example 2.

FIG. 4 is a characteristic graph to show the luminance-electric current relationship of the electroluminescence device according to Example 2; and FIG. 5 is a characteristic graph of an emission spectrum of the electroluminescence device according to Example 2.

Here, for constituent materials of the device which are the same as or equivalent to those in Example 1, the same symbols are used. This is also the same as in Example 3 to Example 6 as described later.

In this Example, the ratio of CBP, used here as the organic compound, to europium iodide, used here as the inorganic compound, was adjusted to be 10/1 in terms of weight, thereby forming an emissive layer 5. The emissive layer was adjusted so as to have a film thickness of 20 nm.

Since other device materials are the same, the description thereof is omitted.

This electroluminescence device was subjected to luminescence by application of an electric current of 685 mA/cm$^2$ at a voltage of 17 V. Its luminance was measured by a luminance meter (MINOLTA LS-110) and found to be 363 cd/m$^2$.

Its luminescence starting voltage was 6 V. Its maximum external quantum efficiency was 0.18% (luminance: 285 cd/m$^2$, electric current: 7.15 mA/cm$^2$).

Also, its emission spectrum was measured by a multi-channel detector (HAMAMATSU PHOTONICS PMA-11).

As a result, emission spectra caused by both CBP (singlet luminescence peak: 404 nm) and europium iodide (luminescence peak: 680 m) were observed. Also, the ratio of these emission spectra was changed by the electric current.

It is considered that this is caused because CBP exhibits an incomplete doped state, and with the increase in the concentration of CBP in the emissive layer, it has become easier to cause luminescence in CBP than europium iodide.

In the light of the above, by using the europium iodide as the inorganic compound and dispersing it in the CBP used here as the organic compound layer and which by itself causes bluish purple luminescence (luminescence peak: about 404 nm), in an amount smaller than that in Example 1, both CBP (luminescence peak: about 404 nm) and europium iodide (luminescence peak: about 687 nm) could be caused to emit light so that an electroluminescence device which emits pink light could be obtained.

EXAMPLE 3

Figure 6:
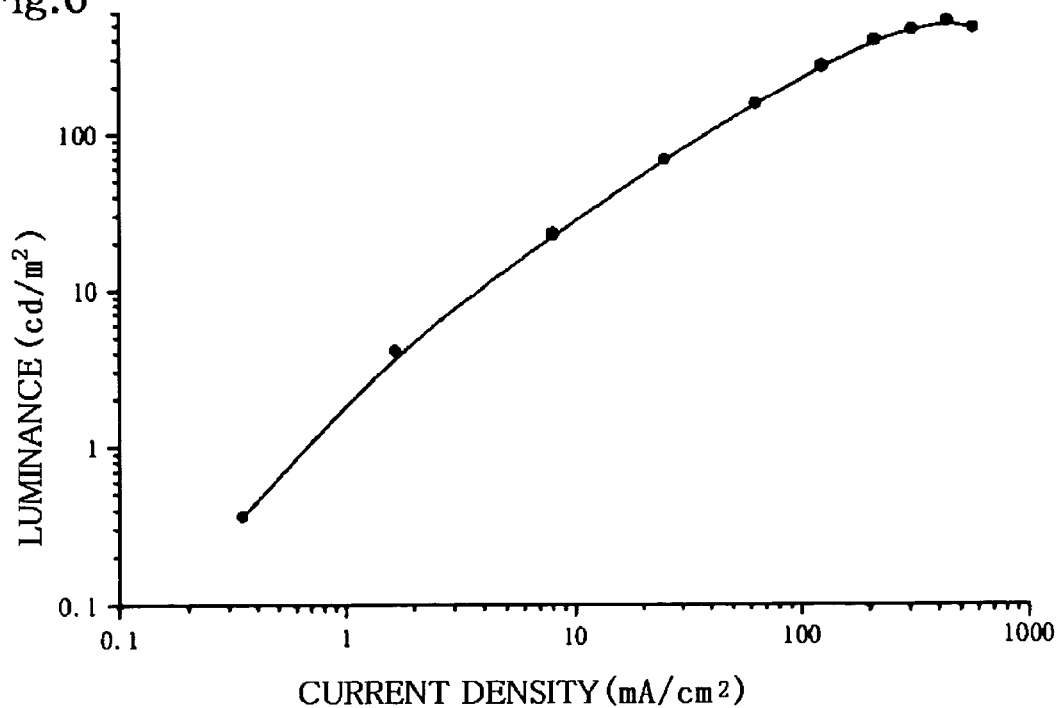
FIG. 6 is a characteristic graph to show the luminance-electric current relationship of the electroluminescence device according to Example 3.
Figure 7:
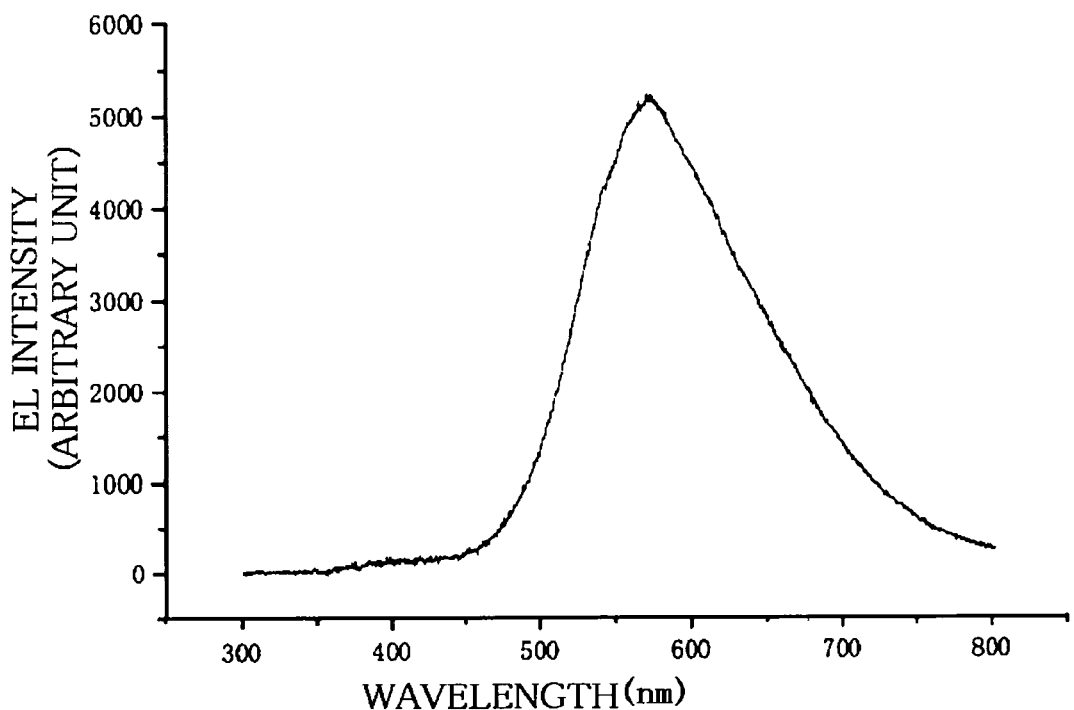
FIG. 7 is a characteristic graph of an emission spectrum of the electroluminescence device according to Example 3.

FIG. 6 is a characteristic graph to show the luminance-electric current relationship of the electroluminescence device according to Example 3; and FIG. 7 is a characteristic graph of an emission spectrum of the electroluminescence device according to Example 3.

In this Example, CBP used here as the organic compound and cerium iodide used here as the inorganic compound were subjected to vapor co-deposition to form an emissive layer 5. A ratio of CBP to cerium iodide was adjusted at 2/1 in terms of a weight ratio, and the emissive layer 5 was adjusted so as to have a film thickness of 20 nm.

Since other device materials are the same, the description thereof is omitted.

This electroluminescence device was subjected to luminescence by application of an electric current of 447.5 mA/cm$^2$ at a voltage of 14 V. Its luminance was measured by a luminance meter (MINOLTA LS-110) and found to be 486 cd/m$^2$. Its luminescence starting voltage was 6 V. Its maximum external quantum efficiency was 0.11% (luminance: 21.7 cd/m$^2$, electric current: 8.05 mA/cm$^2$).

Also, its emission spectrum was measured by a multi-channel detector (HAMAMATSU PHOTONICS PMA-11). As a result, yellow luminescence having a luminescence peak at 574 nm was observed. This luminescence peak does not coincide with the luminescence peak of CBP in the singlet state (404 nm) but is substantially coincident with phosphorescence of CBP, that is, a luminescence peak in the triplet state (559 nm). On the other hand, the luminescence peak of the cerium ion is easily influenced by a crystal field and therefore, cannot be specified.

From these facts, it is posited that the luminescence of this electroluminescence device is caused because by doping the cerium iodide used here as the inorganic compound, the luminescence of the CBP used here as the organic compound in the triplet state is enhanced, or because the cerium iodide used here as the inorganic compound undergoes luminescence by energy transfer from the CBP used here as the organic compound.

In light of the above, by using the cerium iodide as the inorganic compound and dispersing it in the CBP which comprises the organic compound layer and which by itself emits bluish purple light (luminescence peak: about 404 nm), a electroluminescence device which emits yellow light (luminescence peak: about 574 nm) could be obtained.

Now, it is said that the ratio of singlet excitons to triplet excitons generated after recombination of holes and electrons is 1/3. Since conventional organic electroluminescence devices utilize luminescence from a singlet exciton, a limit of the theoretical internal quantum efficiency was 25%. Accordingly, in the case where the luminescence of the electroluminescence device according to this Example is caused by the luminescence of CBP in the triplet state, the luminescence from the triplet exciton can be utilized so that the theoretical limit of internal quantum efficiency is enhanced to 75%, three times the conventional value. Thus, the preparation of electroluminescence devices with high luminescence efficiency is feasible in the future.

This point applies also to the electroluminescence devices shown in Example 4, Example 5 and Example 6 as described later.

EXAMPLE 4

Figure 8:
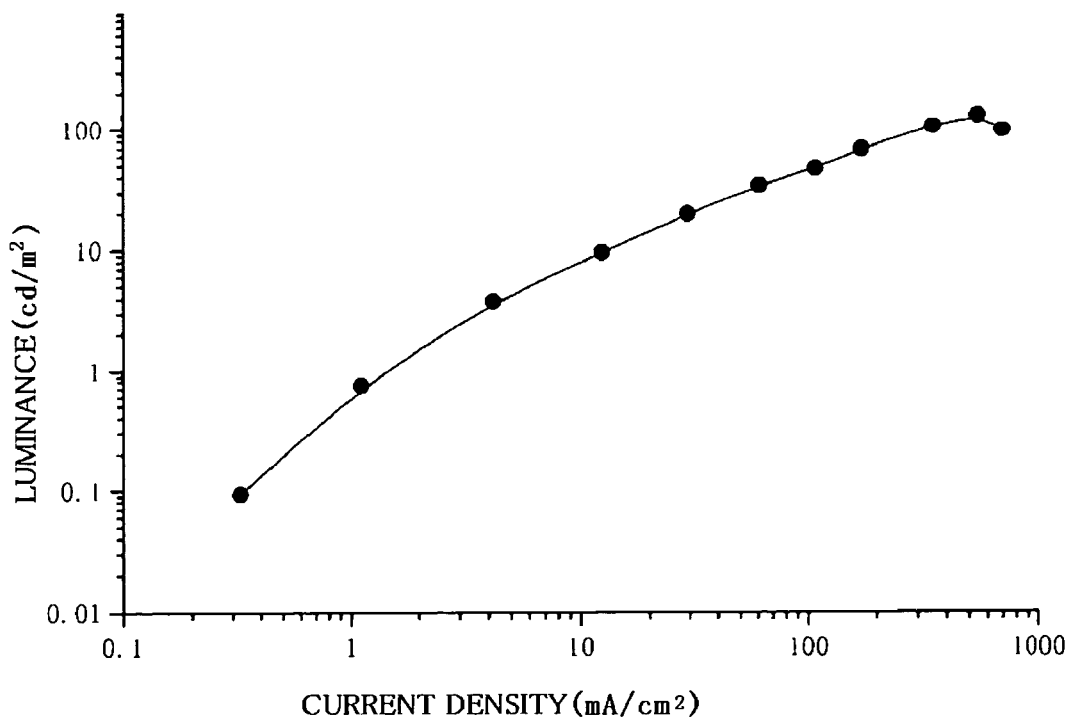
FIG. 8 is a characteristic graph to show the luminance-electric current relationship of the electroluminescence device according to Example 4.
Figure 9:
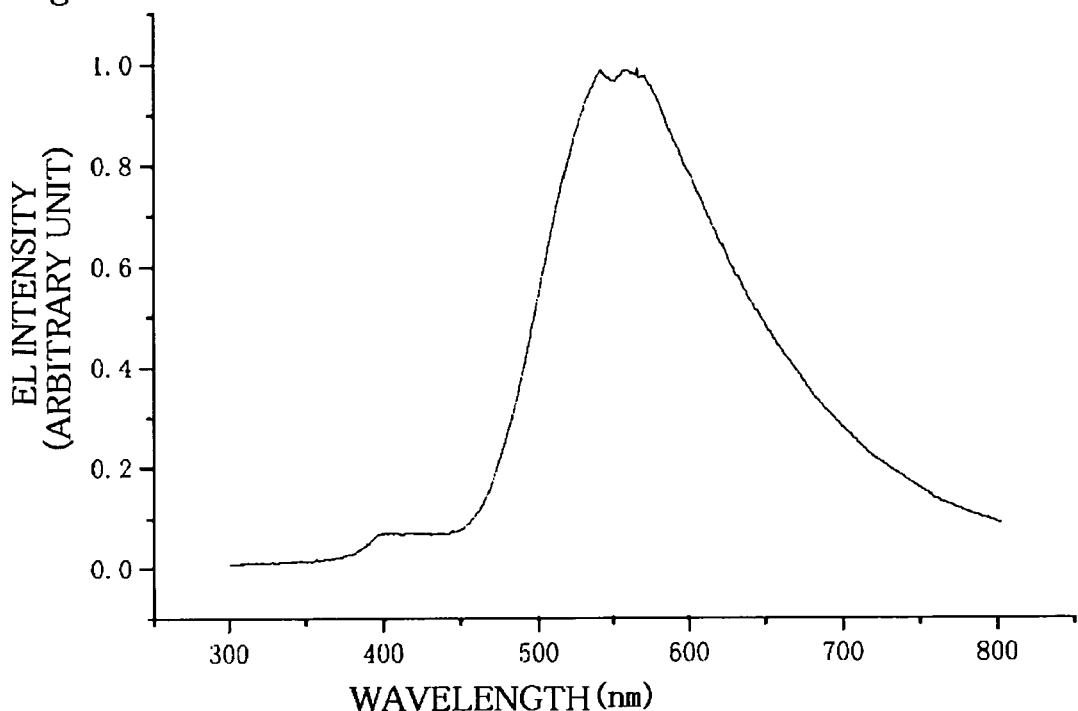
FIG. 9 is a characteristic graph of an emission spectrum of the electroluminescence device according to Example 4.

FIG. 8 is a characteristic graph to show the luminance-electric current relationship of the electroluminescence device according to Example 4; and FIG. 9 is a characteristic graph of an emission spectrum of the electroluminescence device according to Example 4.

In this Example, the CBP used here as the organic compound and the cerium bromide used here as the inorganic compound were subjected to vapor co-deposition to form an emissive layer 5. A ratio of CBP to cerium bromide was adjusted at 2/1 in terms of a weight ratio, and the emissive layer 5 was adjusted so as to have a film thickness of 20 nm.

Since other device materials are the same, the description thereof is omitted.

This electroluminescence device was subjected to luminescence by application of an electric current of 532.5 mA/cm$^2$ at a voltage of 14 V. Its luminance was measured by a luminance meter (MINOLTA LS-110) and found to be 129 cd/m$^2$. Its luminescence starting voltage was 7 V.

Also, its emission spectrum was measured by a multi-channel detector (HAMAMATSU PHOTONICS PMA-11). As a result, green luminescence having a luminescence peak at 553 nm was observed. This luminescence peak does not coincide with the luminescence peak of CBP in the singlet state (404 nm) but is substantially coincident with phosphorescence of CBP, that is, a luminescence peak in the triplet state at 559 nm. On the other hand, as described previously, a luminescence peak of the cerium ion is likely influenced by a crystal field and therefore cannot be specified.

From these facts, it is considered that the luminescence of this electroluminescence device is caused because by doping the cerium bromide used here as the inorganic compound, the luminescence of the CBP used here as the organic compound in the triplet state is enhanced or because the cerium bromide emits light through energy transfer from the CBP used here as the organic compound to the cerium bromide used here as the inorganic compound.

In the light of the above, by using cerium bromide as the inorganic compound and dispersing it in CBP, which comprises the organic compound layer and which by itself emits bluish purple (luminescence peak: about 404 nm), a electroluminescence device which emits green light (luminescence peak: about 553 nm) could be obtained.

EXAMPLE 5

Figure 10:
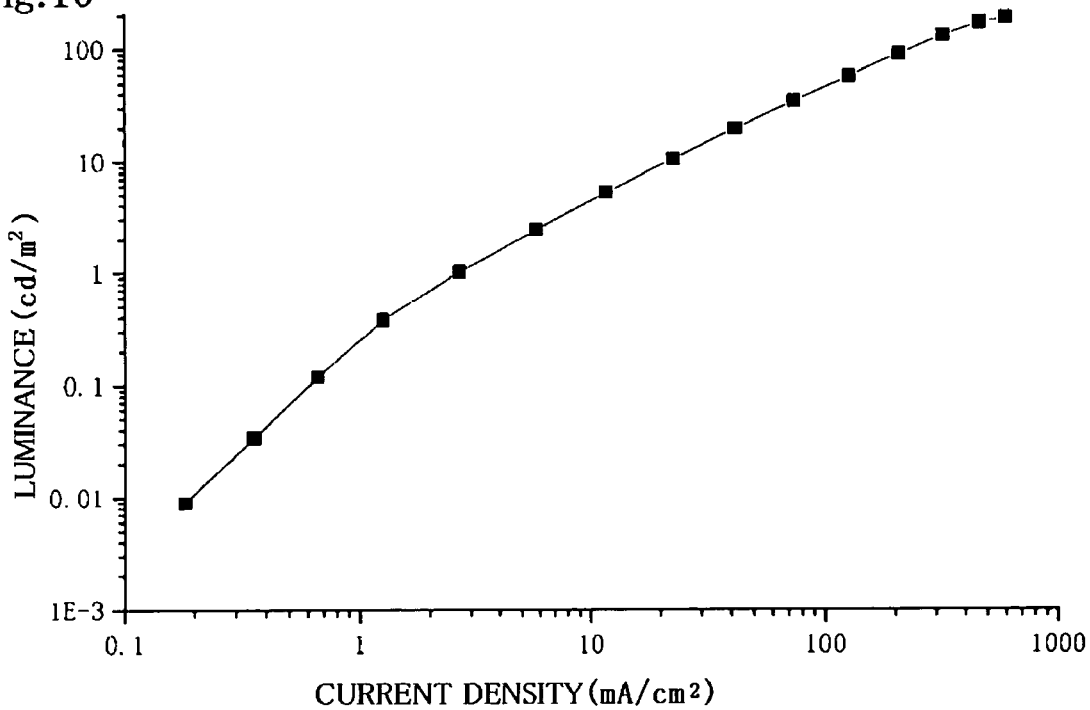
FIG. 10 is a characteristic graph to show the luminance-electric current relationship of the electroluminescence device according to Example 5.
Figure 11:
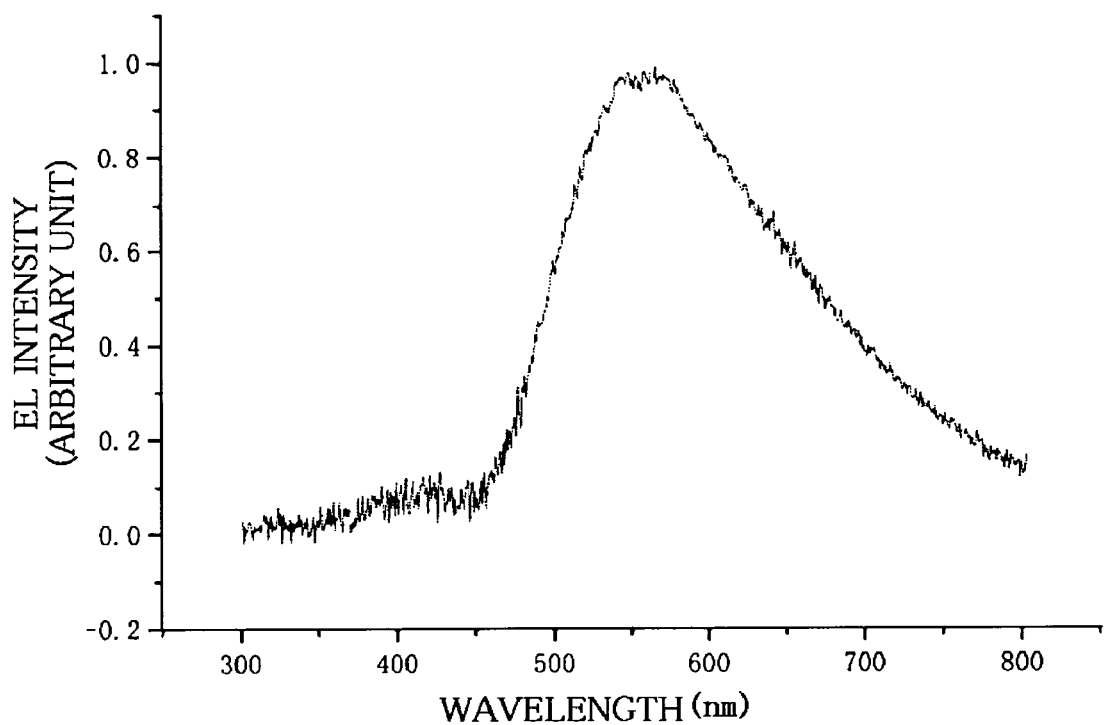
FIG. 11 is a characteristic graph of an emission spectrum of the electroluminescence device according to Example 5.

FIG. 10 is a characteristic graph to show the luminance-electric current relationship of the electroluminescence device according to Example 5; and FIG. 11 is a characteristic graph of an emission spectrum of the electroluminescence device according to Example 5.

In this Example, CBP used here as the organic compound and terbium iodide used here as the inorganic compound were subjected to vapor co-deposition to form an emissive layer 5. The ratio of CBP to terbium iodide was adjusted to be 2/1 in terms of weight, and the emissive layer 5 was adjusted so as to have a film thickness of 20 nm.

Since other device materials are the same, the description thereof is omitted.

This electroluminescence device was subjected to luminescence by application of an electric current of 584.5 mA/cm$^2$ at a voltage of 22 V. Its luminance was measured by a luminance meter (MINOLTA LS-110) and found to be 186 cd/m$^2$. Its luminescence starting voltage was 8 V.

Also, its emission spectrum was measured by a multichannel detector (HAMAMATSU PHOTONICS PMA-11). As a result, yellowish green luminescence having a luminescence peak at 555 nm was observed. This luminescence peak does not coincide with the luminescence peak of CBP in the singlet state (404 nm) but is substantially coincident with phosphorescence of CBP, that is, a luminescence peak in the triplet state at 559 nm.

From these facts, it is considered that the luminescence (at about 555 nm) of this electroluminescence device is caused by the matter that by doping terbium iodide used here as the inorganic compound, the phosphorescence of CBP used here as the organic compound is enhanced or that terbium iodide used here as the inorganic compound emits light through energy transfer from CBP used here as the organic compound to terbium iodide used here as the inorganic compound. However, since the luminescence peak of the terbium ion is sharp at 547 nm, it is likely that the foregoing luminescence peak appearing at 555 nm is not caused by the terbium ion but rather that the phosphorescence of CBP is enhanced.

In the light of the above, by using terbium iodide as the inorganic compound here and dispersing it in CBP which comprises the organic compound layer and which by itself emits bluish purple light (luminescence peak: about 404 nm), a electroluminescence device which emits yellowish green light (luminescence peak: about 555 nm) can be obtained.

EXAMPLE 6

Figure 12:
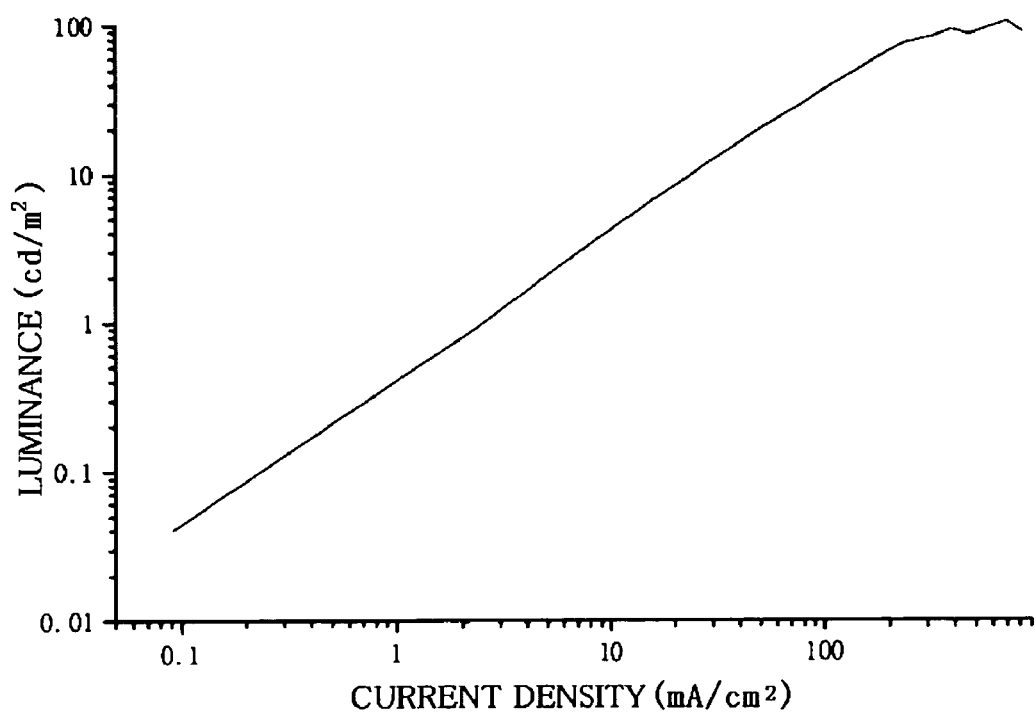
FIG. 12 is a characteristic graph to show the luminance-electric current relationship of the electroluminescence device according to Example 6.
Figure 13:
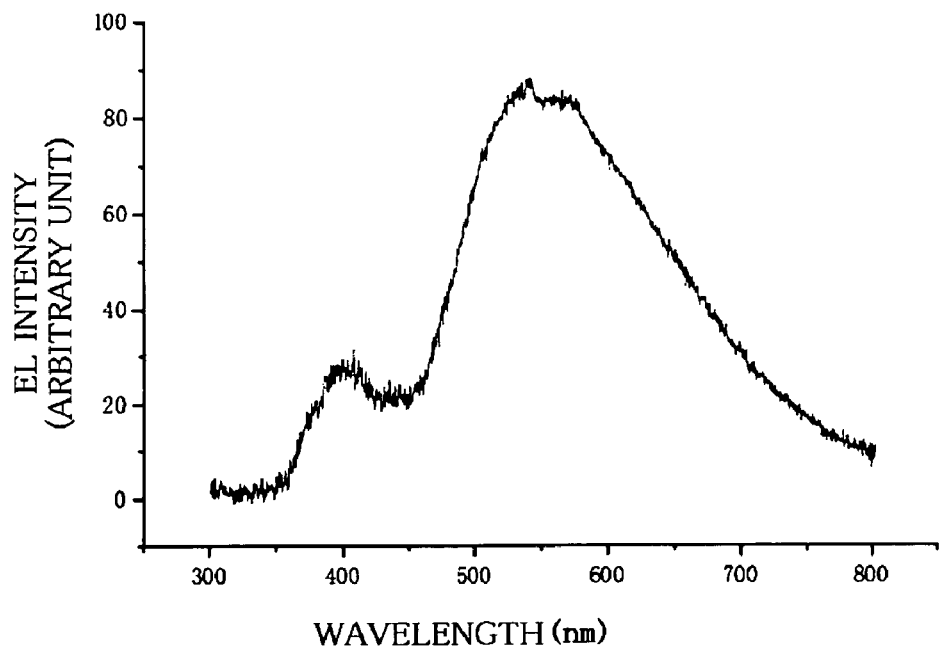
FIG. 13 is a characteristic graph of an emission spectrum of the electroluminescence device according to Example 6.

FIG. 12 is a characteristic graph to show the luminance-electric current relationship of the electroluminescence device according to Example 6; and FIG. 13 is a characteristic graph of an emission spectrum of the electroluminescence device according to Example 6.

In this Example, CBP as an organic compound and lead iodide as an inorganic compound were subjected to vapor co-deposition to form an emissive layer 5. The ratio of CBP to lead iodide was adjusted to be 10/6 in terms of weight, and the emissive layer 5 was adjusted so as to have a film thickness of 20 nm.

Since other device materials are the same, the description thereof is omitted.

This electroluminescence device was caused to emit light by application of an electric current of 702 mA/cm$^2$ at a voltage of 20 V. Its luminance was measured by a luminance meter (MINOLTA LS-110) and found to be 99 cd/m$^2$. Its luminescence starting voltage was 6 V. Its external quantum efficiency was 0.018% (luminance: 2.7 cd/m$^2$, electric current: 6.58 mA/cm$^2$).

Also, its emission spectrum was measured by a multichannel detector (HAMAMATSU PHOTONICS PMA-11). As a result, green luminescence having a luminescence peak at 550 nm was observed. This luminescence peak does not coincide with the luminescence peak of CBP in the singlet state (404 nm) but is substantially coincident with phosphorescence of CBP, that is, a luminescence peak in the triplet state, at 559 nm. On the other hand, a luminescence peak of the lead ion also appears at 500 to 520 nm and is close to the luminescence peak of the electroluminescence device.

From these facts, it is posited that the luminescence (at about 550 nm) of this electroluminescence device 1 is caused because by doping lead iodide used here as the inorganic compound, the luminescence of CBP, used here as the organic compound, in the triplet state is enhanced or that lead iodide used here as the inorganic compound emits light through energy transfer from CBP, used here as the organic compound, to lead iodide used here as the inorganic compound.

In the light of the above, by using lead iodide as the inorganic compound and dispersing it in CBP which comprises the organic compound layer and which by itself emits bluish purple luminescence (luminescence peak: about 404 nm), an electroluminescence device which undergoes green luminescence (luminescence peak: about 550 nm) could be obtained.

In Example 3 to Example 6 as described previously, in order to confirm whether the luminescence having a luminescence peak at about 550 to 570 nm is caused by the luminescence (phosphorescence) of CBP, used here as the organic compound, in the triplet state or by the luminescence of an inorganic compound such as cerium iodide and cerium bromide, the following experiments were carried out.

Figure 14:
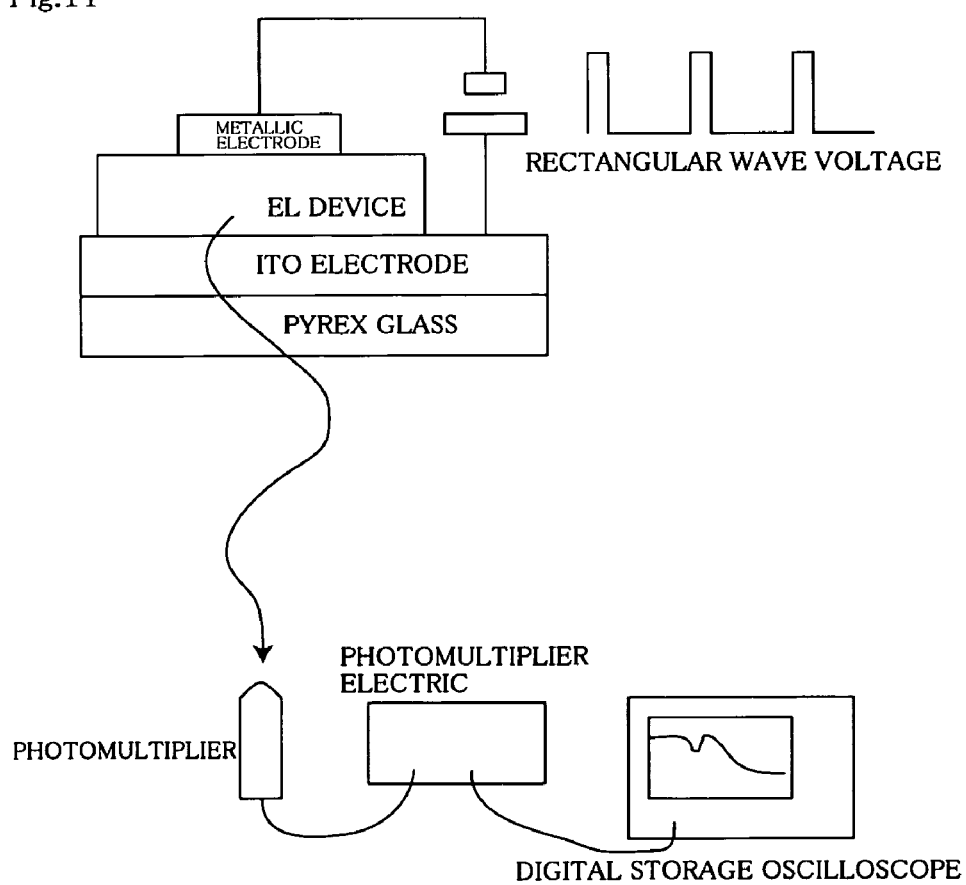
FIG. 14 is a schematic construction view for measuring the luminescence lifetime of the electroluminescence device.

FIG. 14 is a schematic construction view for measuring the luminescence lifetime of the electroluminescence device.

As shown in FIG. 14, a rectangular wave voltage (0 V-7.5 V, repeating frequency: 5 Hz, duty ratio: 5%) was applied to each of the electroluminescence devices, the luminescence was detected by a photomultiplier, and the luminescence lifetime was observed by a digital storage oscilloscope. After cutting off the voltage, the time until the EL intensity was attenuated to 1/e (e of natural logarithm) of the maximum value was measured.

Figure 15:
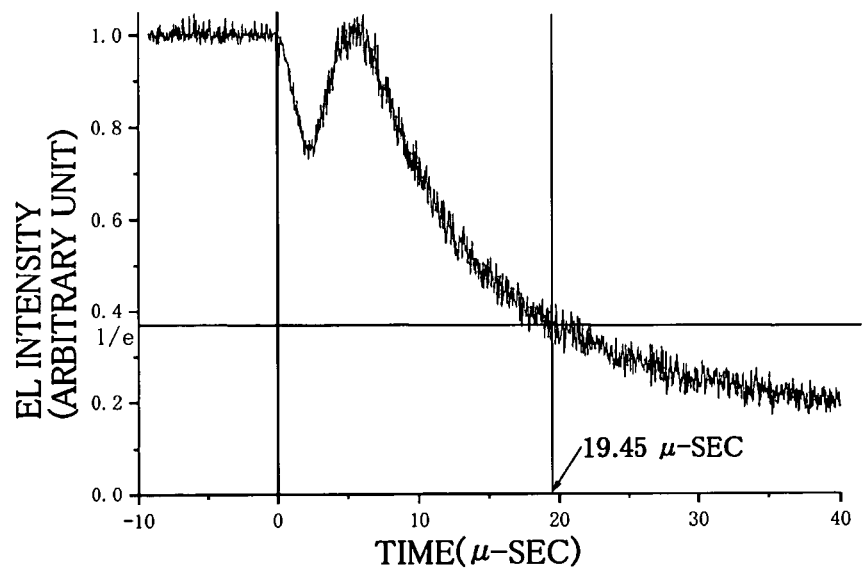
FIG. 15 shows a transient response of an oscilloscope observing the luminescence lifetime of the electroluminescence device according to Example 4.

FIG. 15 shows a transient response of an oscilloscope indicating the luminescence lifetime of the electroluminescence device according to Example 4.

Figure 16:
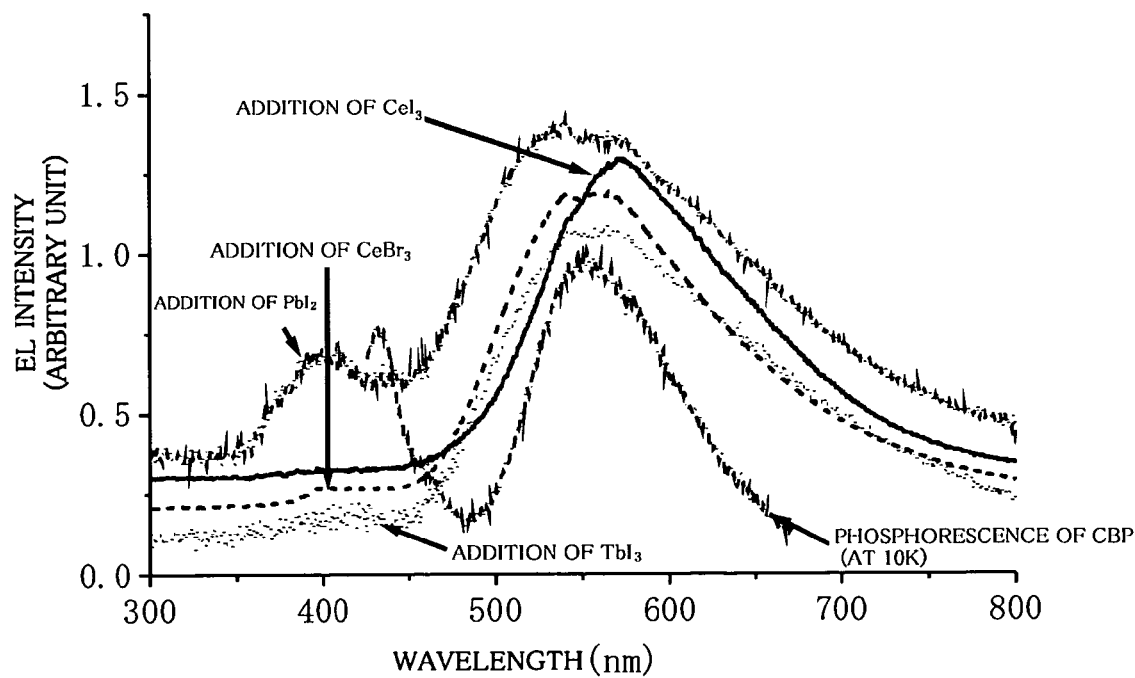
FIG. 16 shows an emission spectrum of each of the electroluminescence devices according to Example 3 to Example 6 and a phosphorescence spectrum of CBP.

FIG. 16 shows an emission spectrum of each of the electroluminescence devices according to Example 3 to Example 6 and a phosphorescence spectrum of CBP.

As shown in FIG. 15, the luminescence lifetime of the electroluminescence device according to Example 4 was long as 19.45 μ-sec. Incidentally, while FIG. 15 shows the electroluminescence device according to Example 4 as one example, in all of the electroluminescence devices of Example 3 to Example 6, the luminescence lifetime was 10 μ-sec or more. When the matter that the luminescence lifetime of an electroluminescence device using a general fluorescent dye is not more than 1 μ-sec (nano-second order) is taken into consideration, it was noted that the luminescence lifetime of the electroluminescence devices of Example 3 to Example 6 is long and falls within the life region of phosphorescence.

Further, as shown in FIG. 16, the emission spectrum of each of the electroluminescence devices qualitatively coincides with the emission spectrum of phosphorescence of CBP.

Thus, from the facts that the luminescence lifetime of each of the electroluminescence devices falls with the lifetime range of phosphorescence and that the emission spectrum of each of the electroluminescence devices qualitatively coincides with the emission spectrum of phosphorescence of CBP, it has become clear that the luminescence of each of the resulting electroluminescence devices is caused by the luminescence of CBP, here used as the organic compound, in the triplet state (phosphorescence).

In the light of the above, since the luminescence of each of the electroluminescence devices is caused by the luminescence of CBP in the triplet state (phosphorescence), as described previously, the luminescence from the triplet exciton can be utilized, and the preparation of electroluminescence devices which emit light with a high efficiency is feasible in the future.

EXAMPLE 7

Figure 17:
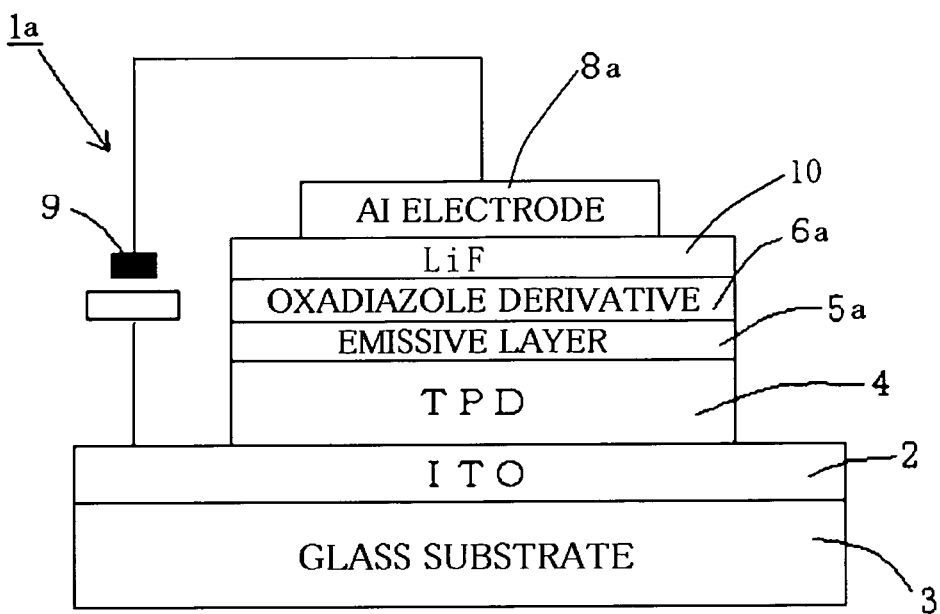
FIG. 17 is an explanatory side view to show Example 7 of the electroluminescence device according to the invention.
Figure 18:
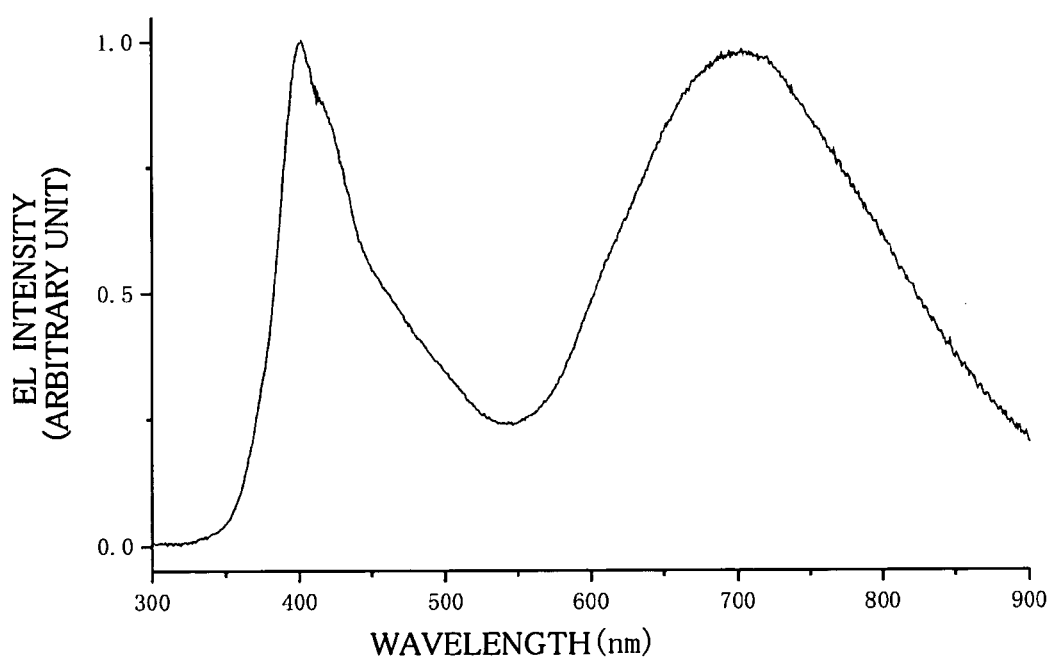
FIG. 18 is a characteristic graph of an emission spectrum of the electroluminescence device as shown in FIG. 17.

FIG. 17 is an explanatory side view to show Example 7 of the electroluminescence device according to the invention; and FIG. 18 is a characteristic graph of an emission spectrum of the electroluminescence device as shown in FIG. 17.

For constituent materials of the device which are the same as or equivalent to those in Example 1, the same symbols are used.

As Example 7, an electroluminescence device 1a was prepared in the following manner.

On a glass substrate 3 in which a transparent electrode 2 constructed of ITO was sputtered in a thickness of 100 nm, N,N'-bis(3-methylphenyl)-N,N'-bis(phenyl)-benzidine (TPD) was vapor deposited in a thickness of about 60 nm by the vacuum vapor deposition method (degree of vacuum: $2.0 \times 10^{-4}$ Pa, hereinafter the same), thereby forming a hole transporting layer 4.

An emissive layer 5a was then formed thereon. The emissive layer 5a was formed by vapor co-deposition of CBP used here as the organic compound and europium bromide used here as the inorganic compound. The ratio of CBP to europium bromide was adjusted to be 75/25 in terms of weight. The emissive layer 5 was adjusted so as to have a film thickness of 20 nm.

The vapor deposition rate was 3 angstroms/sec for CBP and 1 angstrom/sec for europium bromide, respectively.

Further, a hole blocking layer-serving electron transporting layer 6a having a thickness of 60 nm was then formed thereon by vapor deposition using an oxadiazole derivative (OXD-7).

An electron injection layer 10 having a thickness of 0.7 nm was then formed thereon by vapor deposition using lithium fluoride (LiF). Also, about 100 nm of aluminum was vapor deposited as an electrode thereon, thereby obtaining a cathode 8a. Incidentally, in the drawing, 9 stands for an electrode.

This electroluminescence device 1a was subjected to luminescence by application of an electric current of 420 mA/cm² at a voltage of 18 V.

Its luminance was measured by a luminance meter (MINOLTA LS-110) and found to be 40.9 cd/m².

Also, its emission spectrum was measured by a multichannel detector (HAMAMATSU PHOTONICS PMA-11). As a result, an emission peak caused by CBP (singlet luminescence peak: 404 nm) and a broad emission spectrum having a peak at about 700 nm were observed. Also, the ratio of these emission spectra was changed by the electric current.

It is likely that this is because CBP exhibits an incomplete doped state and the concentration of CBP in the emissive layer is high, so that light is emitted from CBP more easily than europium bromide. Incidentally, it is considered that the broad luminescence having a peak at about 700 nm is caused by luminescence of europium bromide taking an amorphous state.

In the light of the above, by using europium bromide as an inorganic compound and dispersing it in CBP which comprises the organic compound layer and which by itself emits bluish purple light (luminescence peak: about 404 nm), both CBP (luminescence peak: about 404 nm) and europium bromide (luminescence peak: about 700 nm) could be caused to emit light so that a electroluminescence device which undergoes pinkish white luminescence could be obtained.

EXAMPLES 8 TO 10

Figure 19:
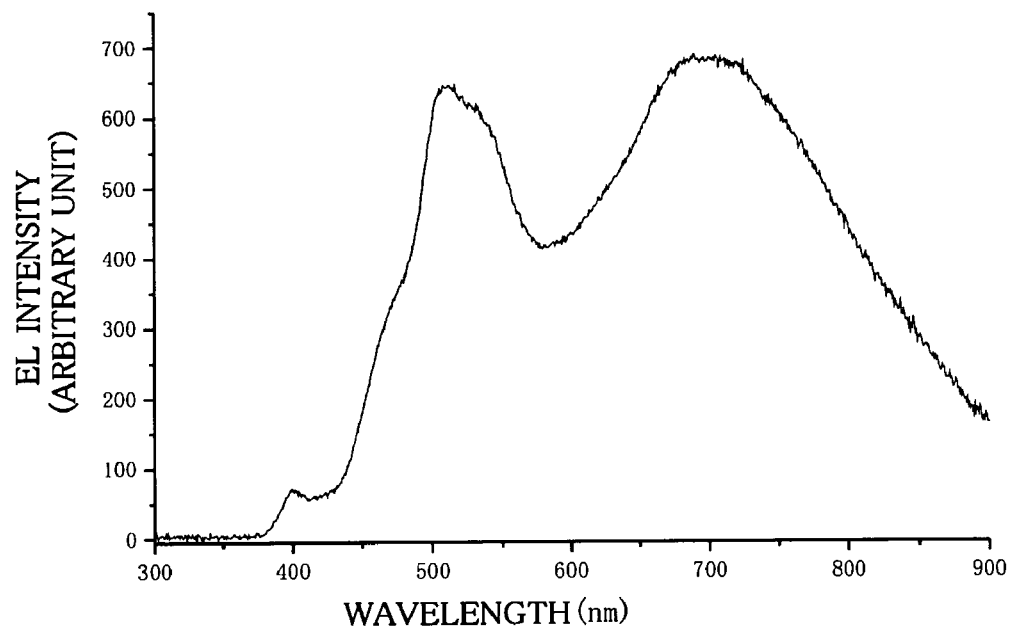
FIG. 19 is a characteristic graph of an emission spectrum of the electroluminescence device according to Example 8.
Figure 20:
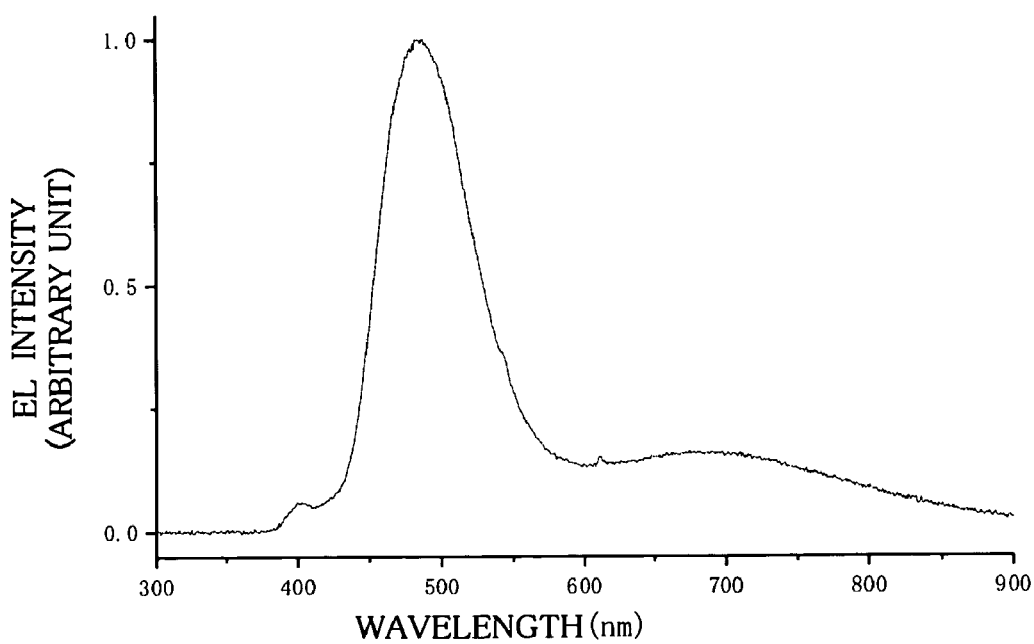
FIG. 20 is a characteristic graph of an emission spectrum of the electroluminescence device according to Example 9.
Figure 21:
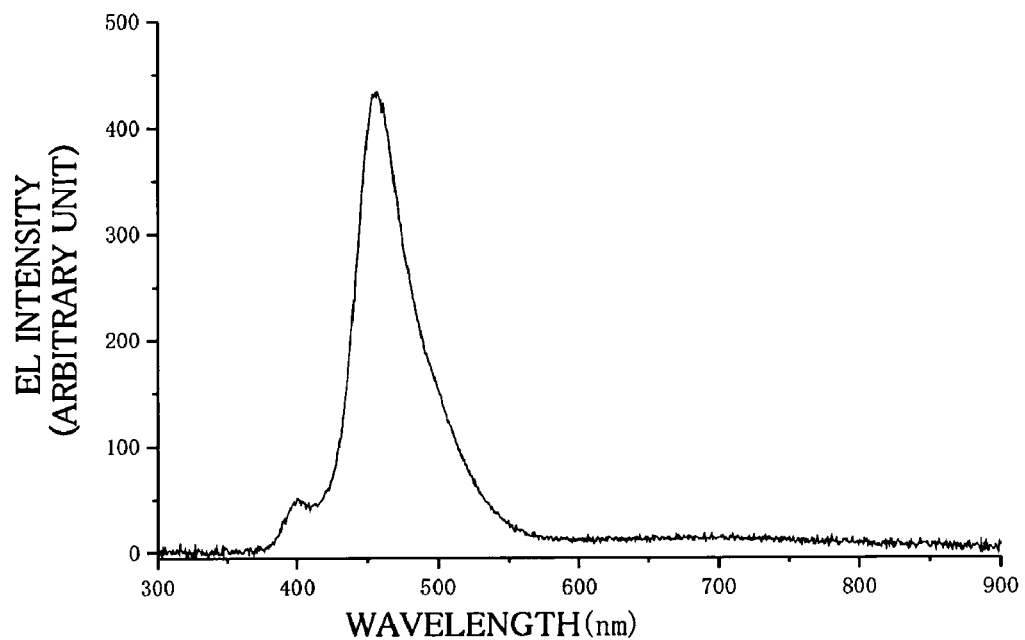
FIG. 21 is a characteristic graph of an emission spectrum of the electroluminescence device according to Example 10.

FIG. 19 is a characteristic graph of an emission spectrum of the electroluminescence device according to Example 8;

FIG. 20 is a characteristic graph of an emission spectrum of the electroluminescence device according to Example 9; and FIG. 21 is a characteristic graph of an emission spectrum of the electroluminescence device according to Example 10.

In Example 7, the emissive layer was formed by vapor co-deposition of CBP and europium bromide, whereas in Examples 8 to 10, the emissive layer was formed by the triple simultaneous vapor deposition method with cesium iodide in addition to CBP and europium bromide. Then, how the emission spectrum was influenced by changing the amount of cesium iodide which is vapor deposited was studied.

Incidentally, since device materials other than the emissive layer are the same, the description thereof is omitted.

The vapor deposition rate is from 1 to 3 angstroms/sec for CBP, from 0.1 to 1 angstroms/sec for europium bromide, and from 0.1 to 1 angstroms/sec for cesium iodide, respectively.

The composition proportion of europium bromide and cesium iodide in each of the emissive layers of Examples 8 to 10 are shown in Table 1 along with that in Example 7.

Incidentally, the composition of the emissive layer is expressed in terms of % by weight, with the total sum of CBP, europium and cesium iodide being 100%.

TABLE 1

Composition proportion of europium bromide and cesium iodide in emissive layer

|  | Example 7 | Example 8 | Example 9 | Example 10 |
|---|---|---|---|---|
| Europium bromide (% by weight) | 25 | 29 | 12.5 | 20 |
| Cesium iodide (% by weight) | 0 | 14 | 12.5 | 40 |

Emission spectra of the electroluminescence devices according to Example 7 to Example 10 as shown in FIG. 18 to FIG. 21 will be hereunder made by reference.

As is clear from the emission spectrum of each of the electroluminescence devices, it could be confirmed that by increasing the proportion of cesium iodide vapor deposited from 0 to 40% by weight, a sharp luminescence peak at about 460 to 480 nm which is a wavelength region exhibiting a blue color is obtained.

Now, blue luminescent materials (for example, α-NPD, perylene, and PVK) which are used in conventional organic electroluminescence devices have a broad luminescence wavelength, and the bottom edge of these emission spectra make the color purity of blue color worse. In order to achieve good blue display, a color filter capable of cutting lights of other wavelength regions than the blue color can be obtained, but is not only the structure complicated but also the costs are high, and also the efficiency is lowered because lights of other regions than the blue color are cut. Thus, in a display device intended to achieve full color display, such as flat panel displays, it is not preferable that the blue color purity is not improved.

However, in the present Examples, by increasing the proportion of cesium iodide to europium bromide, it is possible to obtain an organic electroluminescence device exhibiting blue luminescence with good color purity.

Although this reason is not clear, it is considered that by forming a solid solution of europium bromide in cesium iodide, europium bromide which was in the amorphous state can take a crystal state (hexa-coordinated octahedral structure), thereby exhibiting blue luminescence.

Also, it is considered that this luminescence mechanism is substantially the same as the fluorescence of various fluorescent material powders of an alkali halide doped with $Eu^{2+}$ (europium ion) as described in the document [Optical adsorption, and emission spectra of $Eu^{2+}$ in the alkali halides., J. Hernandez A., F. J. Lopez, H. Murrieta S., *J. Phys. Soc. Jpn.*, vol. 50, No. 1, p. 225-229 (1981)].

EXAMPLE 11

Figure 22:
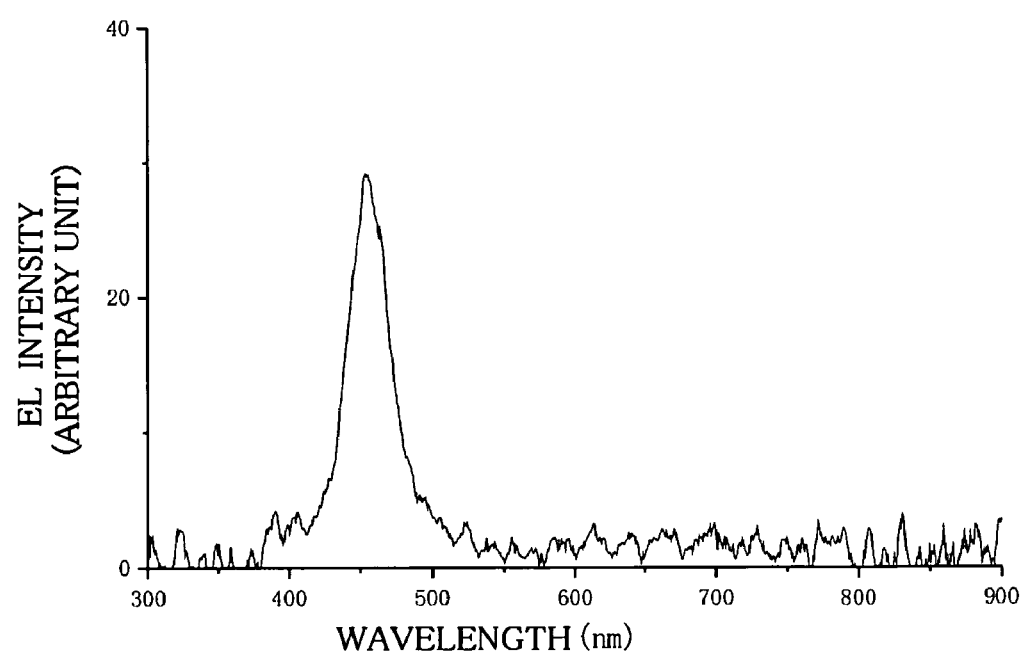
FIG. 22 is a characteristic graph of an emission spectrum of the electroluminescence device according to Example 11.

FIG. 22 is a characteristic graph of an emission spectrum of the electroluminescence device according to Example 11.

This Example is different from Examples 8 to 10 in that the emissive layer was formed by the triple simultaneous vapor deposition method with barium iodide in addition to CBP and europium iodide.

Since other device materials are the same, the description thereof is omitted.

The vapor deposition rate is from 1 to 3 angstroms/sec for CBP, from 0.1 to 1 angstroms/sec for europium iodide, and from 0.1 to 1 angstroms/sec for barium iodide, respectively.

As is clear from the emission spectrum of the electroluminescence device as shown in FIG. 22, it could be confirmed that by adding barium iodide, a sharp luminescence peak at about 454 nm as a wavelength region exhibiting a blue color is obtained. This behavior is explicitly different from that in the electroluminescence devices according to Example 1 (see FIG. 3) and Example 2 (see FIG. 5) in which no barium iodide is added.

In this way, by adding barium iodide in the emissive layer, an organic electroluminescence device exhibiting blue luminescence with good color purity could be obtained.

Although this reason is not clear, it is considered that by forming a solid solution of europium iodide in barium iodide, europium iodide which was in the amorphous state can take a crystal state (hexa-coordinated octahedral structure), thereby exhibiting blue luminescence.

As is clear from Example 1 to Example 11 as described previously, in the present Examples, by dispersing various inorganic compounds in CBP as an organic compound which is a host material, it was possible to change the luminescent color from a blue region (bluish purple) to a red region (pink or pinkish white). Namely, it could be confirmed that by replacing the inorganic compound which is dispersed, various luminescent colors can be obtained from the organic compound as the same host material.

Incidentally, the terminologies as used in this specification are used only for description purposes and are not limitative, and any terminologies and expressions equivalent to the foregoing terminologies and expressions are not excluded.

INDUSTRIAL APPLICABILITY

According to the invention, by dispersing an inorganic compound in a single organic compound layer or at least one of plural organic compound layers provided between an anode and a cathode to prepare an electroluminescence device, it is possible to obtain an electroluminescence device capable of causing the inorganic compound to emit under a direct current voltage (low voltage). In this way, the results of useful studies (on such properties as luminescence) regarding inorganic electroluminescence devices which have been made can be effectively utilized.

Also, since an inorganic compound is caused to emit light, in comparison with organic electroluminescence devices using an organic compound in the emissive layer, it is feasible that an electroluminescence device will be developed which does not readily deteriorate and is durable over a long period of time.

Also, according to the invention, by dispersing an inorganic compound in an organic compound layer as an emissive layer, it is possible to change the luminescent color of the electroluminescence device.

Further, according to the invention, by replacing the inorganic compound to be dispersed in the organic compound layer, it is possible to change the luminescent color of the electroluminescence device. Namely, by replacing the inorganic compound to be dispersed, it is possible to obtain various luminescent colors (broad luminescent region) from the same organic compound host material. Accordingly, for example, in the case of manufacturing a display using the electroluminescence device according to the invention, since necessary types of host materials can be reduced, it is possible to suppress the manufacturing costs of the display in consequence.

When the organic compound is CBP and the inorganic compound is at least one compound selected from the group consisting of cerium iodide, cerium bromide, terbium iodide, and lead iodide, since the luminescence of the electroluminescence device is caused by luminescence of CBP in the triplet state (phosphorescence), the luminescence from the triplet exciton can be utilized, and therefore, the preparation of electroluminescence devices which emit light with a high efficiency is feasible in the future.

When the inorganic compound is a combination of a europium halide and a halide of an alkali metal or a combination of a europium halide and a halide of an alkaline earth metal, it is possible to obtain an organic electroluminescence device exhibiting blue luminescence with good color purity.

The invention claimed is:

1. An electroluminescence device for emitting light by recombination of a hole injected from an anode and an electron injected from a cathode, comprising:
   a single or a plural of an organic compound layer disposed between the foregoing electrodes; and
   a metal halide compound selected from the group consisting of chlorides, bromides, and iodides dispersed in at least one of the organic compound layers, thereby changing the luminescent color;

wherein luminescence of the metal halide compound is achieved by a direct current voltage.

2. An electroluminescence device for emitting light by recombination of a hole injected from an anode and an electron injected from a cathode, comprising:
a single or a plural of an organic compound layer disposed between the foregoing electrodes; and
a metal halide compound selected from the group consisting of chlorides, bromides, and iodides dispersed in at least one of the organic compound layers, thereby changing the luminescent color;
wherein the metal halide compound or a part of the metal halide compound is replaced to change the luminescent color.

3. The electroluminescence device according to claim 1, wherein the metal halide compound or a part of the metal halide compound is replaced to change the luminescent color.

4. An electroluminescence device for emitting light by recombination of a hole injected from an anode and an electron injected from a cathode, comprising:
a single or a plural of an organic compound layer disposed between the foregoing electrodes; and
a metal halide compound selected from the group consisting of chlorides, bromides, and iodides dispersed in at least one of the organic compound layers, thereby changing the luminescent color;
wherein the metal halide compound is a transition metal halide.

5. The electroluminescence device according to claim 1, wherein the metal halide compound is a transition metal halide.

6. The electroluminescence device according to claim 2, wherein the metal halide compound is a transition metal halide.

7. The electroluminescence device according to claim 3, wherein the metal halide compound is a transition metal halide.

8. An electroluminescence device for emitting light by recombination of a hole injected from an anode and an electron injected from a cathode, comprising:
a single or a plural of an organic compound layer disposed between the foregoing electrodes; and
a metal halide compound selected from the group consisting of chlorides, bromides, and iodides dispersed in at least one of the organic compound layers, thereby changing the luminescent color;
wherein the metal halide compound is a rare earth metal halide.

9. The electroluminescence device according to claim 1, wherein the metal halide compound is a rare earth metal halide.

10. The electroluminescence device according to claim 2, wherein the metal halide compound is a rare earth metal halide.

11. The electroluminescence device according to claim 3, wherein the metal halide compound is a rare earth metal halide.

12. An electroluminescence device for emitting light by recombination of a hole injected from an anode and an electron injected from a cathode, comprising:
a single or a plural of an organic compound layer disposed between the foregoing electrodes; and
a metal halide compound selected from the group consisting of chlorides, bromides, and iodides dispersed in at least one of the organic compound layers, thereby changing the luminescent color;
wherein the metal halide compound is at least one compound selected from the group consisting of europium iodide, europium bromide, cerium iodide, cerium bromide, terbium iodide, and lead iodide.

13. The electroluminescence device according to claim 1, wherein the metal halide compound is at least one compound selected from the group consisting of europium iodide, europium bromide, cerium iodide, cerium bromide, terbium iodide, and lead iodide.

14. The electroluminescence device according to claim 2, wherein the metal halide compound is at least one compound selected from the group consisting of europium iodide, europium bromide, cerium iodide, cerium bromide, terbium iodide, and lead iodide.

15. The electroluminescence device according to claim 3, wherein the metal halide compound is at least one compound selected from the group consisting of europium iodide, europium bromide, cerium iodide, cerium bromide, terbium iodide, and lead iodide.

16. An electroluminescence device for emitting light by recombination of a hole inected from an anode and an electron injected from a cathode, comprising:
a single or a plural of an organic compound layer disposed between the foregoing electrodes; and
a metal halide compound selected from the group consisting of chlorides, bromides, and iodides dispersed in at least one of the organic compound layers, thereby changing the luminescent color; wherein
the organic compound is 4,4-bis (carbazol-9-yl)-biphenyl; and
the metal halide compound is at least one compound selected from the group consisting of cerium iodide, cerium bromide, terbium iodide, and lead iodide.

17. The electroluminescence device according to claim 1, wherein
the organic compound is 4,4-bis (carbazol-9-yl)-biphenyl; and
the metal halide compound is at least one compound selected from the group consisting of cerium iodide, cerium bromide, terbium iodide, and lead iodide.

18. The electroluminescence device according to claim 2, wherein
the organic compound is 4,4-bis (carbazot-9-yl)-biphenyl; and
the metal halide compound is at least one compound selected from the group consisting of cerium iodide, cerium bromide, terbium iodide, and lead iodide.

19. The electroluminescence device according to claim 3, wherein
the organic compound is 4,4-bis (carbazol-9-yl)-biphenyl; and
the metal halide compound is at least one compound selected from the group consisting of cerium iodide, cerium bromide, terbium iodide, and lead iodide.

20. An electroluminescence device for emitting light by recombination of a hole injected from an anode and an electron injected from a cathode, comprising:
a single or a plural of an organic compound layer disposed between the foregoing electrodes; and
a metal halide compound selected from the group consisting of chlorides, bromides, and iodides dispersed in at least one of the organic compound layers, thereby changing the luminescent color;
wherein the metal halide compound is a combination of a halide of europium and a halide of an alkali metal or a combination of a halide of europium and a halide of an alkaline earth metal.

21. The electroluminescence device according to claim 1, wherein the metal halide compound is a combination of a halide of europium and a halide of an alkali metal or a combination of a halide of europium and a halide of an alkaline earth metal.

22. The electroluminescence device according to claim 2, wherein the metal halide compound is a combination of a halide of europium and a halide of an alkali metal or a combination of a halide of europium and a halide of an alkaline earth metal.

23. The electroluminescence device according to claim 3, wherein the metal halide compound is a combination of a halide of europium and a halide of an alkali metal or a combination of a halide of europium and a halide of an alkaline earth metal.

* * * * *